(12) United States Patent
Saito et al.

(10) Patent No.: US 7,443,267 B2
(45) Date of Patent: Oct. 28, 2008

(54) LOW-PASS FILTER AND LOW-PASS FILTER ARRAY

(75) Inventors: Yo Saito, Tokyo (JP); Izuru Soma, Tokyo (JP); Hitoshi Tanaka, Tokyo (JP)

(73) Assignee: TDK Corporation, Tokyo (JP)

( * ) Notice: Subject to any disclaimer, the term of this patent is extended or adjusted under 35 U.S.C. 154(b) by 80 days.

(21) Appl. No.: 11/723,300

(22) Filed: Mar. 19, 2007

(65) Prior Publication Data
US 2007/0229190 A1    Oct. 4, 2007

(30) Foreign Application Priority Data
Mar. 29, 2006    (JP)    ............................. 2006-091089

(51) Int. Cl.
*H03H 7/00*    (2006.01)
(52) U.S. Cl. ................. 333/172; 333/174; 333/185
(58) Field of Classification Search ............... 333/172, 333/174, 185
See application file for complete search history.

(56) References Cited

U.S. PATENT DOCUMENTS

2006/0077646 A1 * 4/2006 Ahn et al. .................. 361/793

2007/0252659 A1 * 11/2007 Suenaga et al. ............... 333/32

FOREIGN PATENT DOCUMENTS

JP    A 10-191555    7/1998

* cited by examiner

*Primary Examiner*—Vibol Tan
*Assistant Examiner*—Jason Crawford
(74) *Attorney, Agent, or Firm*—Oliff & Berridge, PLC

(57) ABSTRACT

A low-pass filter comprises a capacitor, first and second varistors, a resistor, and first to third external electrodes. The capacitor includes a dielectric body and first to third internal electrodes. The first internal electrode is connected to the third external electrode physically and electrically. The second internal electrode is connected to the second external electrode physically and electrically. At least a portion of the second internal electrode opposes the first internal electrode through at least a portion of the dielectric body. The third internal electrode is connected to the first external electrode physically and electrically. At least a portion of the third internal electrode opposes the first internal electrode through at least a portion of the dielectric body. The first varistor is connected in parallel to a capacitor constituted by the first and third internal electrodes. The second varistor is connected in parallel to a capacitor constituted by the first and second internal electrodes. The resistor is connected electrically to the second and third internal electrodes.

11 Claims, 11 Drawing Sheets

LOW-PASS FILTER AND LOW-PASS FILTER ARRAY

BACKGROUND OF THE INVENTION

1. Field of the Invention

The present invention relates to a low-pass filter and a low-pass filter array.

2. Related Background Art

As digital consumer electronics have been increasing, high-speed transmission circuits have been more in demand. An example of the high-speed transmission circuits is a low-pass filter having an ESD protection function. For example, a low-pass filter comprising a π-type filter equipped with a coil and two capacitors, and a zener diode connected in parallel to one of the capacitors provided in the π-filter has been known (see, for example, Japanese Patent Application Laid-Open No. HEI 10-191555).

SUMMARY OF THE INVENTION

Currently, for realizing the low-pass filter disclosed in the above-mentioned Japanese Patent Application Laid-Open No. HEI 10-191555, the coil components, capacitor components, and zener diode have been mounted onto a substrate. Therefore, the low-pass filter disclosed in the above-mentioned Patent Document 1 has a large mounting area. In particular, the zener diode has a large height, whereby the region required for mounting it becomes greater.

For solving the problem mentioned above, it is an object of the present invention to provide a low-pass filter and a low-pass filter array which improve their packaging density while having an ESD protection function.

The low-pass filter of the present invention comprises a capacitor including a dielectric body having first and second faces opposing each other, and first to third internal electrodes arranged within the dielectric body; first and second varistors arranged on the first face; a resistor arranged on the first face; and first to third external electrodes arranged on the second face; wherein the first internal electrode is arranged so as to be connected to the third external electrode physically and electrically while extending in a direction parallel to the opposing direction of the first and second faces; wherein the second internal electrode is arranged so as to be connected to the second external electrode physically and electrically while at least a portion of the second internal electrode opposes the first internal electrode through at least a portion of the dielectric body; wherein the third internal electrode is arranged so as to be connected to the first external electrode physically and electrically while at least a portion of the third internal electrode opposes the first internal electrode through at least a portion of the dielectric body; wherein the first varistor is connected in parallel to a capacitor constituted by the first and third internal electrodes; wherein the second varistor is connected in parallel to a capacitor constituted by the first and second internal electrodes; and wherein the resistor is connected electrically to the second and third internal electrodes.

In the low-pass filter of the present invention, the capacitor constituted by the first and third internal electrodes, the capacitor constituted by the first and second internal electrodes, and the resistor construct a π-type RC filter. The first varistor is connected in parallel to the capacitor constituted by the first and third internal electrodes, and the second varistor is connected in parallel to the capacitor constituted by the first and second internal electrodes, thus constructing a low-pass filter having an ESD protection function. Since the first and second varistors and resistor are arranged on the first face of the dielectric body while the first to third external electrodes are arranged on the second face, the low-pass filter having the structure mentioned above can be realized by one chip. This can improve the packaging density of the low-pass filter having the ESD protection function.

Preferably, the first varistor has first and second electrodes and a first varistor layer including a region positioned between the first and second electrodes and exhibiting a nonlinear current-voltage characteristic, whereas the second varistor has third and fourth electrodes and a second varistor layer including a region positioned between the first and second electrodes and exhibiting a nonlinear current-voltage characteristic.

In this case, varistor functions can be exhibited between the first and second electrodes and between the third and fourth electrodes.

Preferably, the first to fourth electrodes are arranged on the first face, the first varistor layer is arranged so as to cover at least a portion of each of the first and second electrodes, the second varistor layer is arranged so as to cover at least a portion of each of the third and fourth electrodes, the first internal electrode is connected to the second and fourth electrodes physically and electrically, the second internal electrode is connected to the third electrode physically and electrically, the third internal electrode is connected to the first electrode physically and electrically, and the resistor is connected to the first and third electrodes physically and electrically.

In this case, the first to fourth electrodes are arranged on the first face, while the first and second varistor layers are arranged so as to cover their corresponding two electrodes, whereby the first and second varistors can be constructed simply. The size in a direction perpendicular to the first face can be made smaller, so as to turn the low-pass filter having the above-mentioned structure into a smaller one-chip component.

Preferably, the first varistor further comprises an electrode arranged so as to oppose the first and second electrodes through the first varistor layer, whereas the second varistor further comprises an electrode arranged so as to oppose the third and fourth electrodes through the second varistor layer.

In this case, the region between the first and second electrodes and the electrode arranged so as to oppose the first and second electrodes in the first varistor exhibits a nonlinear current-voltage characteristic, whereby the first varistor functions as two varistor components connected in series between the first and second electrodes. The region between the third and fourth electrodes and the electrode arranged so as to oppose the third and fourth electrodes in the second varistor exhibits a nonlinear current-voltage characteristic, whereby the second varistor functions as two varistor components connected in series between the third and fourth electrodes.

The low-pass filter array of the present invention comprises a capacitor including a dielectric body having first and second faces opposing each other, and N internal electrode groups (where N is an integer of 2 or greater), arranged within the dielectric body, each having first to third internal electrodes; N first varistors and N second varistors arranged on the first face so as to correspond to the N internal electrode groups; N resistors arranged on the first face so as to correspond to the N internal electrode groups; and N external electrode groups, arranged on the second face so as to correspond to the N internal electrode groups, each having first to third external electrodes; wherein, in each of the internal electrode groups, the first internal electrode is arranged so as to be connected physically and electrically to the third external electrode of the external electrode group corresponding thereto while extending in a direction parallel to the opposing direction of the first and second faces, the second internal electrode is arranged so as to be connected physically and electrically to the second external electrode of the external electrode group corresponding thereto while at least a portion of the second internal electrode opposes the first internal electrode corresponding thereto through at least a portion of the dielectric body, the third internal electrode is arranged so as to be connected physically and electrically to the first external electrode of the external electrode group corresponding thereto while at least a portion of the third internal electrode opposes the first internal electrode corresponding thereto through at least a portion of the dielectric body, each of the first varistors is connected in parallel to a capacitor constituted by the first and third internal electrodes of the internal electrode group corresponding thereto, each of the second varistors is connected in parallel to a capacitor constituted by the first and second internal electrodes of the internal electrode group corresponding thereto, and each of the resistors is connected electrically to the second and third internal electrodes of the internal electrode group corresponding thereto.

In the low-pass filter array of the present invention, N capacitors constituted by N first internal electrodes and N third internal electrodes, N capacitors constituted by N first internal electrodes and N second internal electrodes, and N resistors construct N π-type RC filters. N first varistors are connected in parallel to N capacitors constituted by N first internal electrodes and N third internal electrodes, respectively, whereas N second varistors are connected in parallel to N capacitors constituted by N first internal electrodes and N second internal electrodes, respectively. Therefore, the low-pass filter array of the present invention constructs N low-pass filters having an ESD protection function. Since N first and second varistors and N resistors are arranged on the first face of the dielectric body while N first to third external electrodes are arranged on the second face, the low-pass filter array having the structure mentioned above can be realized by one chip. This can improve the packaging density of the low-pass filter array having the ESD protection function.

Preferably, the N internal electrode groups are arranged in a row within the dielectric body along the opposing direction of the first internal electrode and the second and third internal electrodes, and further comprise an internal electrode arranged so as to extend in the direction parallel to the opposing direction of the first and second faces between the internal electrode groups adjacent to each other while being connected electrically to one of the third external electrodes.

In this case, the internal electrode is arranged between the internal electrode groups adjacent to each other while being connected electrically to one of the third external electrodes, whereby a shield effect is exhibited. This can suppress the crosstalk between the internal electrode groups adjacent to each other.

Preferably, each of the first varistors has first and second electrodes and a first varistor layer including a region positioned between the first and second electrodes and exhibiting a nonlinear current-voltage characteristic, whereas each of the second varistors has third and fourth electrodes and a second varistor layer including a region positioned between the first and second electrodes and exhibiting a nonlinear current-voltage characteristic.

In this case, each first varistor can exhibit a varistor function between the first and second electrodes. Each second varistor can exhibit a varistor function between the third and fourth electrodes.

Preferably, the first to fourth electrodes are arranged on the first face, the first varistor layer is arranged so as to cover at least a portion of each of the first and second electrodes, the second varistor layer is arranged so as to cover at least a portion of each of the third and fourth electrodes, the first internal electrode is connected to the second and fourth electrodes physically and electrically, the second internal electrode is connected to the third electrode physically and electrically, the third internal electrode is connected to the first electrode physically and electrically, and the resistor is connected to the first and third electrodes physically and electrically.

In this case, the first to fourth electrodes are arranged on the first face, while the first and second varistor layers are arranged so as to cover their corresponding two electrodes, whereby each of the first and second varistors can be constructed simply. The size in a direction perpendicular to the first face can be made smaller, so as to turn the low-pass filter array having the above-mentioned structure into a smaller one-chip component.

Preferably, each of the first varistors further comprises an electrode arranged so as to oppose the first and second electrodes through the first varistor layer, whereas each of the second varistors further comprises an electrode arranged so as to oppose the third and fourth electrodes through the second varistor layer.

In this case, the region between the first and second electrodes and the electrode arranged so as to oppose the first and second electrodes in each first varistor exhibits a nonlinear current-voltage characteristic, whereby each first varistor functions as two varistor components connected in series between the first and second electrodes. The region between the third and fourth electrodes and the electrode arranged so as to oppose the third and fourth electrodes in each second varistor exhibits a nonlinear current-voltage characteristic, whereby each second varistor functions as two varistor components connected in series between the third and fourth electrodes.

Preferably, the N internal electrode groups are arranged in a row within the dielectric body along the opposing direction of the first internal electrode and the second and third internal electrodes, the first and second electrodes of the first varistors are respectively arranged in a row along the direction of the row of the N internal electrode groups, the first varistor layers of the first varistors are formed integrally, the third and fourth electrodes of the second varistors are respectively arranged in a row along the direction of the row of the N internal electrode groups, and the second varistor layers of the second varistors are formed integrally.

In this case, the first and second varistor layers function as reinforcements, whereby the mechanical strength of the low-pass filter can be enhanced.

Preferably, the third external electrodes of the external electrode groups are formed integrally.

The present invention can provide a low-pass filter and a low-pass filter array which improve the packaging density while having an ESD protection function.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

In the following, best modes for carrying out the present invention will be explained in detail with reference to the accompanying drawings. In the explanation of the drawings, the same constituents will be referred to with the same numerals without repeating their overlapping descriptions.

First Embodiment

Figure 1:
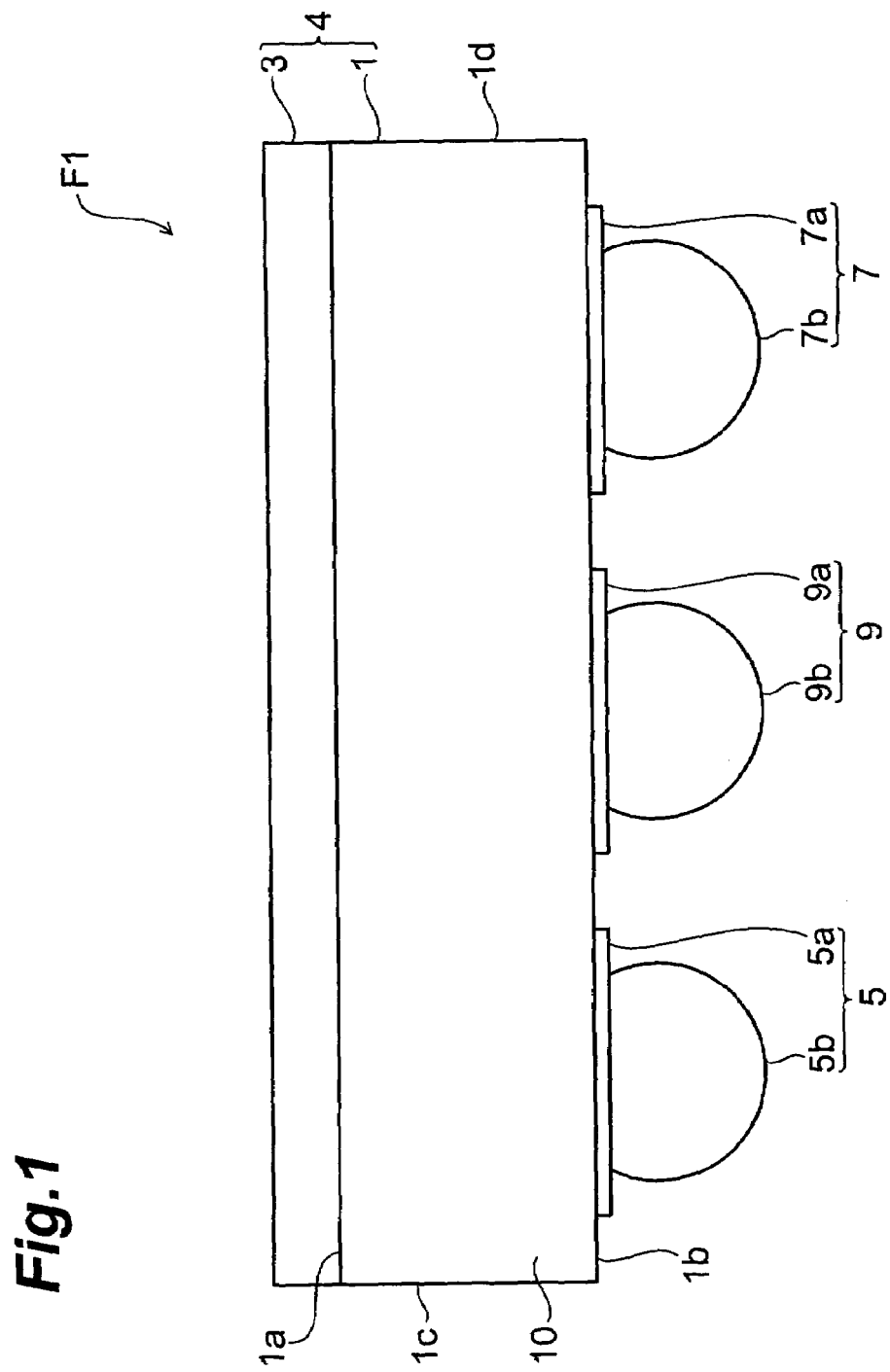
FIG. 1 is a schematic plan view showing the low-pass filter in accordance with the first embodiment.

A low-pass filter in accordance with a first embodiment will be explained. FIG. 1 is a plan view showing the low-pass filter F1 in accordance with the first embodiment. The low-pass filter F1 in accordance with this embodiment comprises a capacitor part 1, a varistor resistor part 3, a pair of I/O terminal electrodes 5, 7 (first and second external electrodes), and a ground terminal electrode 9 (third external electrode).

The capacitor part 1 is formed into a substantially rectangular parallelepiped shape having first and second faces 1a, 1b opposing each other and end faces 1c, 1d, perpendicular to the first and second faces 1a, 1b, opposing each other. The varistor resistor part 3 is arranged on the first face 1a of the capacitor part 1. The capacitor part 1 and varistor resistor part 3 constitute a main body 4. The main body 4 has a substantially rectangular parallelepiped form. For example, the main body 4 has a length of about 0.5 mm, a width of about 1.6 mm, and a thickness of about 0.6 mm.

One of the pair of I/O terminal electrodes 5, 7 functions as an input terminal electrode, whereas the other functions as an output terminal electrode. The ground terminal electrode 9 is connected to a ground pattern of an external board (not depicted) to which the low-pass filter F1 is mounted.

The I/O terminal electrodes 5, 7 and ground terminal electrode 9 are arranged on the second face 1b while being electrically insulated from each other. The I/O terminal electrode 5 is arranged on the end face 1c side. The I/O terminal electrode 7 is arranged on the end face 1d side. The ground terminal electrode 9 is arranged between the I/O terminal electrodes 5, 7. The I/O terminal electrodes 5, 7 and ground terminal electrode 9 construct a ball grid array structure.

The I/O terminal electrode 5 comprises a metal pad 5a formed on the second face 1b and a solder ball 5b connected to the metal pad 5a physically and electrically. The metal pad 5a is formed into a substantially rectangular shape when seen in a direction perpendicular to the second face 1b.

The I/O terminal electrode 7 comprises a metal pad 7a formed on the second face 1b and a solder ball 7b connected to the metal pad 7a physically and electrically. The metal pad 7a is formed into a substantially rectangular shape when seen in a direction perpendicular to the second face 1b.

The ground terminal electrode 9 comprises a metal pad 9a formed on the second face 1b and a solder ball 9b connected to the metal pad 9a physically and electrically. The metal pad 9a is formed into a substantially rectangular shape when seen in a direction perpendicular to the second face 1b.

Figure 2:
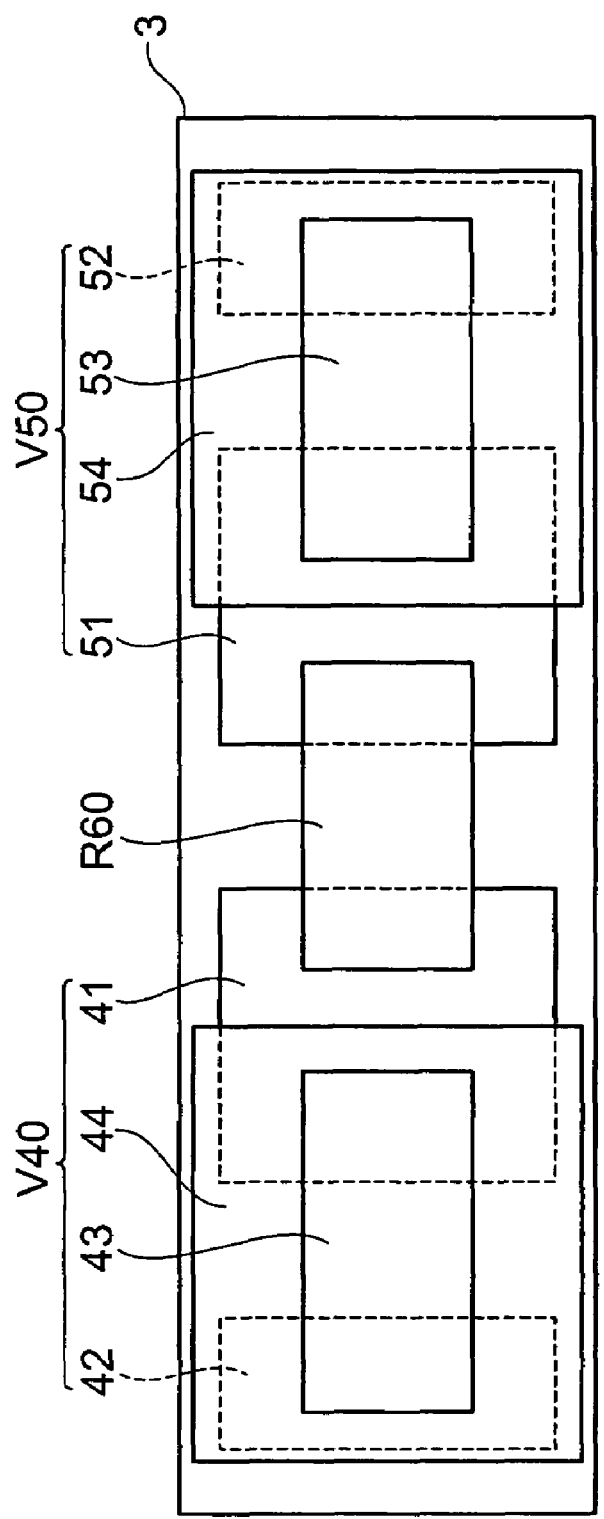
FIG. 2 is a view showing the varistor resistor part included in the low-pass filter in accordance with the first embodiment.
Figure 3:
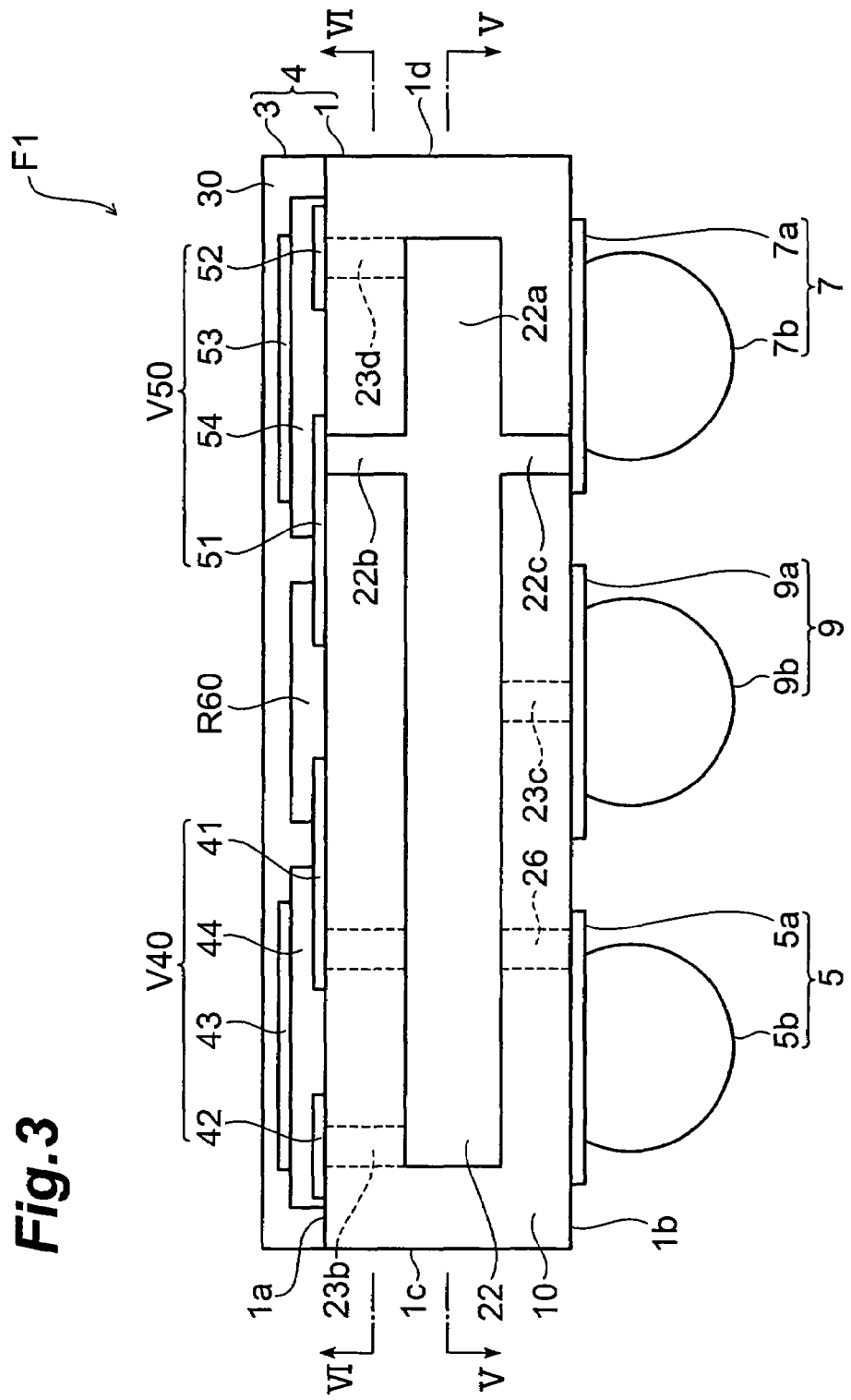
FIG. 3 is a schematic view showing a cross-sectional structure of the low-pass filter in accordance with the first embodiment.

FIG. 2 is a view showing the varistor resistor part included in the low-pass filter in accordance with the first embodiment. FIG. 3 is a sectional view of the low-pass filter in accordance with the first embodiment. The varistor resistor part 3 comprises a protective layer 30, a first varistor V40, a second varistor V50, and a resistor R60. The first and second varistors V40, V50 and resistor R60 are arranged on the first face 1a of the capacitor part 1.

The protective layer 30 is formed on the first face 1a so as to cover the first and second varistors V40, V50 and resistor R60. The protective layer 30 forms the outer shape of the varistor resistor part 3, whereas the first and second varistors V40, V50 and resistor R60 are arranged within the protective layer 30.

The protective layer 30 is an insulator mainly composed of glass. The protective layer 30 has a function of electrically insulating the first and second varistors V40, V50 and resistor R60 from the outside. The protective layer 30 also has a function of protecting the first and second varistors V40, V50 and resistor R60. FIG. 2 is a plan view of the varistor resistor part 3, which omits the protective layer 30.

The first varistor V40 is arranged on the first face 1a on the end face 1c side. The second varistor V50 is arranged on the first face 1a on the end face 1d side. The resistor R60 is arranged between the first and second varistors V40, V50 on the first face 1a.

The first varistor V40 comprises a first varistor electrode 41 (first electrode), a second varistor electrode 42 (second electrode), a third varistor electrode 43 (electrode), and a first varistor layer 44.

The first varistor electrode 41 is arranged on the first face 1a on the resistor R60 side. The second varistor electrode 42 is arranged on the first face 1a on the end face 1c side. The first and second varistor electrodes 41, 42 are electrically insulated from each other. Each of the first and second varistor electrodes 41, 42 has a substantially rectangular form when seen in a direction perpendicular to the first face 1a.

The first varistor layer 44 is formed so as to be arranged on the first face 1a while covering the portion of the first varistor electrode 41 on the end face 1c side and the whole second varistor electrode 42. Namely, the first varistor layer 44 has a portion covering the first varistor electrode 41, a portion covering the second varistor electrode 42, and a portion covering the first face 1a. In the first varistor layer 44, a portion of the portion covering the first face 1a is positioned between the first and second varistor electrodes 41, 42. The first varistor layer 44 has a substantially rectangular form when seen in a direction perpendicular to the first face 1a. The first varistor layer 44 exhibits a nonlinear current-voltage characteristic. The first varistor layer 44 is mainly composed of ZnO and contains Co.

The third varistor electrode 43 is arranged on the first varistor layer 44. The third varistor electrode 43 has a substantially rectangular form when seen in a direction perpendicular to the first face 1a. The third varistor electrode 43 is arranged so as to oppose a portion of the first varistor electrode 41 through the first varistor layer 44. The third varistor electrode 43 is also arranged so as to oppose a portion of the second varistor electrode 42 through the first varistor layer 44.

The first varistor layer 44 has a region overlapping the first and third varistor electrodes 41, 43 when seen in a direction perpendicular to the first face 1a. Therefore, the first and third varistor electrodes 41, 43 and the first varistor layer 44 function as one varistor component. The first varistor layer 44 also has a region overlapping the second and third varistor electrodes 42, 43 when seen in a direction perpendicular to the first face 1a. Therefore, the second and third varistor electrodes 42, 43 and the first varistor layer 44 function as one varistor component. Namely, the first varistor V40 functions as two varistor components connected in series between the first and second varistor electrodes 41, 42.

The second varistor V50 comprises a first varistor electrode 51 (third electrode), a second varistor electrode 52 (fourth electrode), a third varistor electrode 53 (electrode), and a second varistor layer 54.

The first varistor electrode 51 is arranged on the first face 1a on the resistor R60 side. The second varistor electrode 52 is arranged on the first face 1a on the end face 1d side. The first and second varistor electrodes 51, 52 are electrically insulated from each other. Each of the first and second varistor electrodes 51, 52 has a substantially rectangular form when seen in a direction perpendicular to the first face 1a.

The second varistor layer 54 is formed so as to be arranged on the first face 1a while covering the portion of the first varistor electrode 51 on the end face 1d side and the whole second varistor electrode 52. Namely, the second varistor layer 54 has a portion covering the first varistor electrode 51, a portion covering the second varistor electrode 52, and a portion covering the first face 1a. In the second varistor layer 54, a portion of the portion covering the first face 1a is positioned between the first and second varistor electrodes 51, 52. The second varistor layer 54 has a substantially rectangular form when seen in a direction perpendicular to the first face 1a. The second varistor layer 54 exhibits a nonlinear current-voltage characteristic. The second varistor layer 54 is mainly composed of ZnO and contains Co.

The third varistor electrode 53 is arranged on the second varistor layer 54. The third varistor electrode 53 has a substantially rectangular form when seen in a direction perpendicular to the first face 1a. The third varistor electrode 53 is arranged so as to oppose a portion of the first varistor electrode 51 through the second varistor layer 54. The third varistor electrode 53 is also arranged so as to oppose a portion of the second varistor electrode 52 through the second varistor layer 54.

The second varistor layer 54 has a region overlapping the first and third varistor electrodes 51, 53 when seen in a direction perpendicular to the first face 1a. Therefore, the first and third varistor electrodes 51, 53 and the second varistor layer 54 function as one varistor component. The second varistor layer 54 also has a region overlapping the second and third varistor electrodes 52, 53 when seen in a direction perpendicular to the first face 1a. Therefore, the second and third varistor electrodes 52, 53 and the second varistor layer 54 function as one varistor component. Namely, the second varistor V50 functions as two varistor components connected in series between the first and second varistor electrodes 51, 52.

The resistor R60 is arranged on the first face 1a so as to cover a portion of the first varistor electrode 41 on the resistor R60 side and a portion of the first varistor electrode 51 on the resistor R60 side. The resistor R60 is connected to the first varistor electrodes 41, 51 physically and electrically. The resistor R60 has a substantially rectangular form when seen in a direction perpendicular to the first face 1a.

Figure 4:
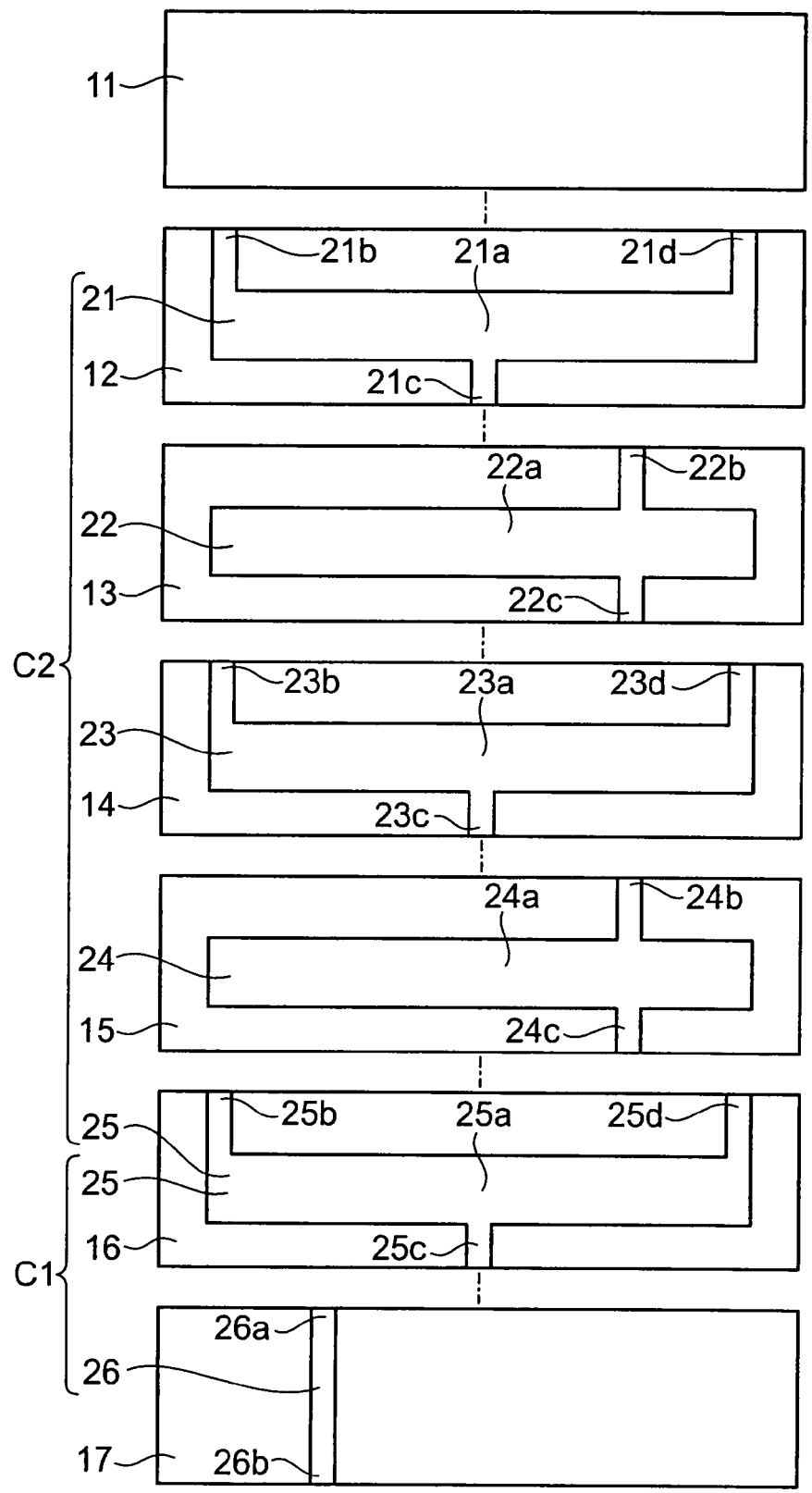
FIG. 4 is an exploded view showing the capacitor part included in the low-pass filter in accordance with the first embodiment.
Figure 5:
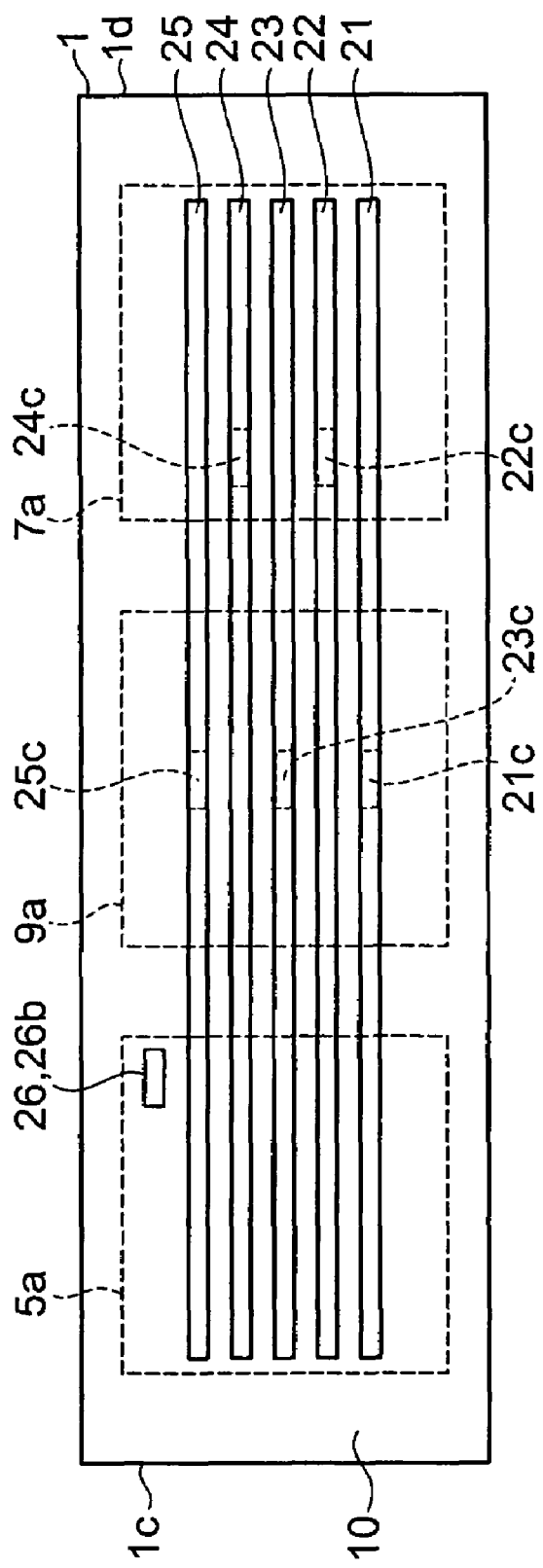
FIG. 5 is a schematic view showing a cross-sectional structure taken along the line V-V of FIG. 3.
Figure 6:
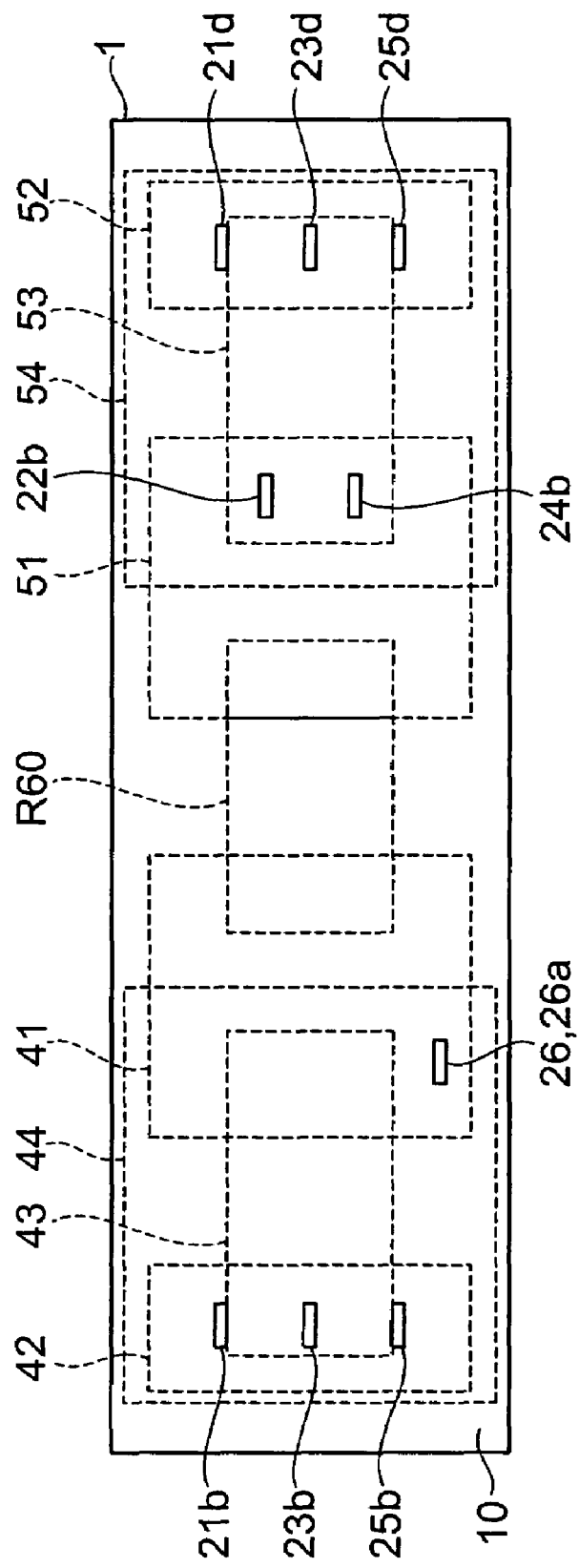
FIG. 6 is a schematic view showing a cross-sectional structure taken along the line VI-VI of FIG. 3.

FIG. 4 is an exploded view showing the capacitor part included in the low-pass filter in accordance with the first embodiment. FIG. 5 is a schematic view showing a cross-sectional structure taken along the line V-V of FIG. 3. FIG. 6 is a schematic view showing a cross-sectional structure taken along the line VI-VI of FIG. 3.

The capacitor part 1 is constructed by laminating a dielectric body 11 and a plurality of (6 in this embodiment) dielectric bodies 12 to 17 formed with first internal electrodes 21, 23, 25, second internal electrodes 22, 24, and a third internal electrode 26. In the actual low-pass filter F1, a plurality of dielectric bodies 11 to 17 are integrated to such an extent that boundaries therebetween are indiscernible. The dielectric bodies 11 to 17 are mainly composed of $BaTiO_3$ and contain Co.

Each of the dielectric bodies 11 to 17 is formed like a substantially rectangular plate. Laminating the dielectric bodies 11 to 17 constructs a dielectric body 10 having a substantially rectangular parallelepiped form. The dielectric body 10 forms the outer shape of the capacitor part 1. Namely, the dielectric body 10 has the first and second faces 1a, 1b opposing each other and the end faces 1c, 1d opposing each other. The laminating direction of the dielectric bodies 11 to 17 is perpendicular to the opposing direction of the first and second faces 1a, 1b of the capacitor part 1 and the opposing direction of the end faces 1c, 1d of the capacitor part 1. Namely, in each of the dielectric bodies 11 to 17, side faces parallel to the longitudinal direction opposing each other constitute the first and second faces 1a and 1b, respectively. Also, in each of the dielectric bodies 11 to 17, side faces parallel to the transversal direction opposing each other constitute the end faces 1c and 1d, respectively.

The first internal electrodes 21, 23, 25 are formed by printing respective substantially rectangular parallelepiped patterns on the dielectric bodies 12, 14, 16. The first internal electrodes 21, 23, 25 include main electrode portions 21a, 23a, 25a, first lead portions 21b, 23b, 25b, second lead portions 21c, 23c, 25c, and third lead portions 21d, 23d, 25d. Each of the main electrode portions 21a, 23a, 25a has a substantially rectangular parallelepiped form. The main electrode portions 21a, 23a, 25a are formed such that their center portions are positioned at their corresponding center portions of the dielectric bodies 12, 14, 16.

The first lead portions 21b, 23b, 25b are led from the portions on the end face 1c side of the first face 1a side of the main electrode portions 21a, 23a, 25a to the first face 1a, so as to be exposed at the first face 1a. The second lead portions 21c, 23c, 25c are led from the center portions on the second face 1b side of the main electrode portions 21a, 23a, 25a to the second face 1b, so as to be exposed at the second face 1b. The third lead portions 21d, 23d, 25d are led from the portions on the end face 1d side of the first face 1a side of the main electrode portions 21a, 23a, 25a to the first face 1a, so as to be exposed at the first face 1a.

The second internal electrodes 22, 24 are formed by printing respective substantially rectangular parallelepiped patterns on the dielectric bodies 13, 15. The second internal electrodes 22, 24 include main electrode portions 22a, 24a, first lead portions 22b, 24b, and second lead portions 22c, 24c. Each of the main electrode portions 22a, 24a has a substantially rectangular parallelepiped form. The main electrode portions 22a, 24a are formed such that their center portions are positioned at their corresponding center portions of the dielectric bodies 13, 15.

The first lead portions 22b, 24b are led from near the midpoints between the center portions on the first face 1a side of the main electrode portions 22a, 24a and their portions on the end face 1d side to the first face 1a, so as to be exposed at the first face 1a. The second lead portions 22c, 24c are led from near the midpoints between the center portions on the second face 1b side of the main electrode portions 22a, 24a and their portions on the end face 1d side to the second face 1b, so as to be exposed at the second face 1b.

The third internal electrode 26 is formed by printing a linear pattern on the dielectric body 17. Near the midpoint between the center portion of the dielectric body 17 and its portion on the end face 1c side, the third internal electrode 26 is formed parallel to the edge on the end face 1c side of the dielectric body 17. The third internal electrode 26 has one end portion 26a exposed at the first face 1a, and the other end portion 26b exposed at the second face 1b.

The first internal electrode 21 and second internal electrode 22 are laminated such that their main electrode portions 21a, 22a oppose each other through the dielectric body 12. The second internal electrode 22 and first internal electrode 23 are laminated such that their main electrode portions 22a, 23a oppose each other through the dielectric body 13. The first internal electrode 23 and second internal electrode 24 are laminated such that their main electrode portions 23a, 24a oppose each other through the dielectric body 14. The second internal electrode 24 and first internal electrode 25 are laminated such that their main electrode portions 24a, 25a oppose each other through the dielectric body 15. The first internal electrode 25 and third internal electrode 26 are laminated such that they partly oppose each other through the dielectric body 16.

In each of the first to third internal electrodes 21 to 26, faces opposing each other are arranged perpendicular to the first and second faces 1a, 1b. Namely, the first to third internal electrodes 21 to 26 are arranged so as to extend in a direction parallel to the opposing direction of the first and second faces 1a, 1b. Also, the first and second internal electrodes 21 to 25 are arranged such that their main electrode portions 21a to 25a are overlaid on each other when seen in the laminating direction.

As shown in FIG. 5, the metal pad 9a is placed where the second lead portions 21c, 23c, 25c are exposed in the second face 1b, so that the second lead portions 21c, 23c, 25c are connected to the metal pad 9a physically and electrically. Namely, the first internal electrodes 21, 23, 25 are connected to the ground terminal electrode 9 physically and electrically.

The metal pad 7a is placed where the second lead portions 22c, 24c are exposed in the second face 1b, so that the second lead portions 22c, 24c are connected to the electrode pad 7a physically and electrically. Namely, the second internal electrodes 22, 24 are connected to the I/O terminal electrode 7 physically and electrically.

The metal pad 5a is placed where the end portion 26b of the third internal electrode 26 is exposed in the second face 1b, so that the end portion 26b of the third internal electrode 26 is connected to the metal pad 5a physically and electrically. Namely, the third internal electrode 26 is connected to the I/O terminal electrode 5 physically and electrically.

As shown in FIG. 6, the second varistor electrode 42 is placed where the first lead portions 21b, 23b, 25b are exposed in the first face 1a, so that the first lead portions 21b, 23b, 25b are connected to the second varistor electrode 42 physically and electrically. Namely, the first internal electrodes 21, 23, 25 are connected to the varistor electrode 42 physically and electrically.

The second varistor electrode 52 is placed where the third lead portions 21d, 23d, 25d are exposed in the first face 1a, so that the third lead portions 21d, 23d, 25d are connected to the second varistor electrode 52 physically and electrically. Namely, the first internal electrodes 21, 23, 25 are connected to the second varistor electrode 52 physically and electrically.

The first varistor electrode 51 is placed where the first lead portions 22b, 24b are exposed in the first face 1a, so that the first lead portions 22b, 24b are connected to the first varistor electrode 51 physically and electrically. Namely, the second internal electrodes 22, 24 are connected to the first varistor electrode 51 physically and electrically.

The first varistor electrode 41 is placed where the end portion 26a of the third internal electrode 26 is exposed in the first face 1a, so that the end portion 26a is connected to the first varistor electrode 41 physically and electrically. Namely, the third internal electrode 26 is connected to the first varistor electrode 41 physically and electrically.

Thus, the first internal electrode 25, third internal electrode 26, and dielectric body 16 construct a first capacitor C1. The first and second internal electrodes 21 to 25 and dielectric bodies 12 to 15 construct a second capacitor C2.

The first internal electrodes 21, 23, 25 are connected to the second varistor electrode 42 physically and electrically, whereas the third internal electrode 26 is connected to the first varistor electrode 41 physically and electrically. Namely, the first capacitor C1 and first varistor V40 are connected in parallel to each other. The third internal electrode 26 of the first capacitor C1 is electrically connected to the resistor R60 through the first varistor electrode 41.

The first internal electrodes 21, 23, 25 are connected to the second varistor electrode 52 physically and electrically, whereas the second internal electrodes 22, 24 are connected to the first varistor electrode 51 physically and electrically. Namely, the second capacitor C2 and second varistor V50 are connected in parallel to each other. The second internal electrodes 22, 24 of the second capacitor C2 are connected, electrically to the resistor R60 through the first varistor electrode 51.

The first internal electrodes 21, 23, 25 are connected to the ground terminal electrode 9 physically and electrically. Therefore, the second varistor electrode 42 of the first varistor V40 is connected physically and electrically to the ground terminal electrode 9 through the first internal electrodes 21, 23, 25. The second varistor electrode 52 of the second varistor V50 is also connected physically and electrically to the ground terminal electrode 9 through the first internal electrodes 21, 23, 25.

Figure 7:
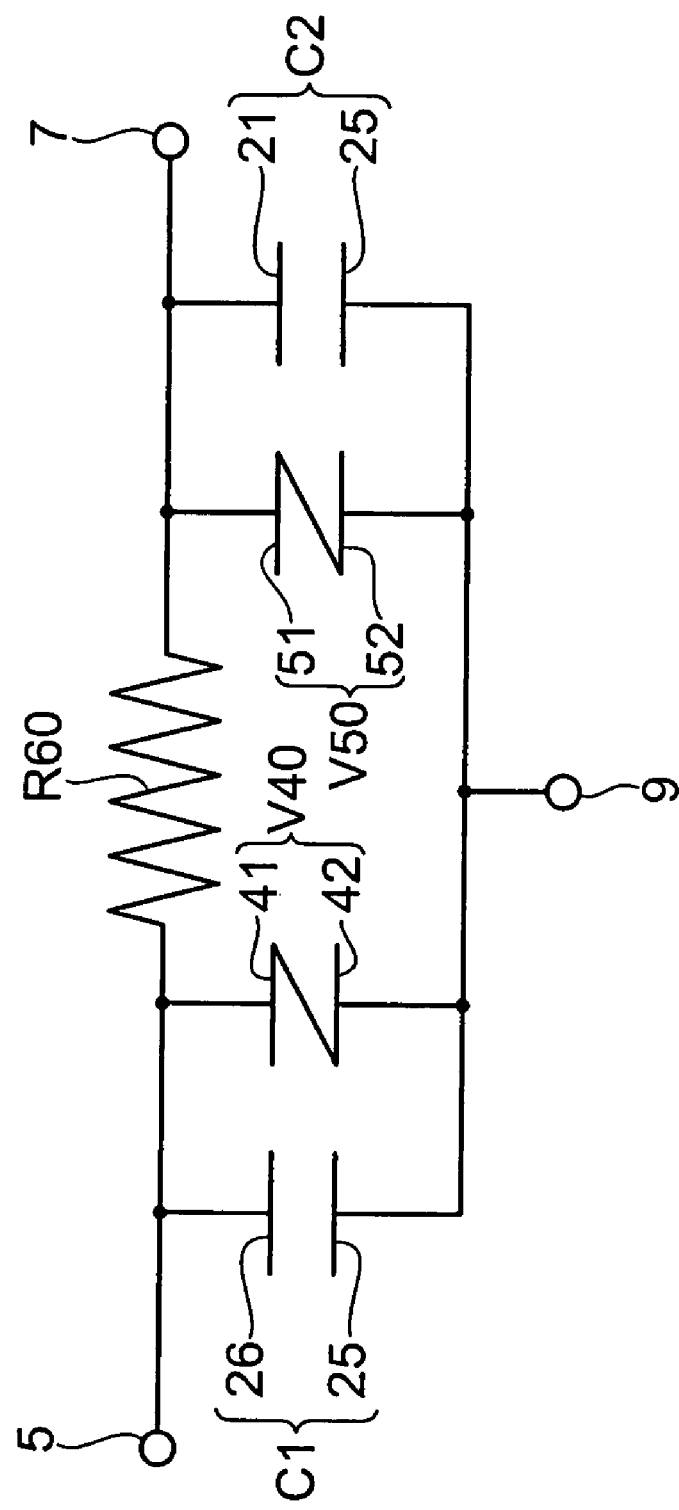
FIG. 7 is an equivalent circuit diagram of the low-pass filter in accordance with the first embodiment.

Namely, as shown in FIG. 7, the low-pass filter F1 constructs a π-type RC filter by the first capacitor C1, second capacitor C2, and resistor R60, and a low-pass filter having an ESD protection function constituted by the first varistor V40 connected in parallel to the first capacitor C1 and the second varistor V50 connected in parallel to the second capacitor C2.

A method of making the low-pass filter F1 will now be explained. First, dielectric green sheets to construct the dielectric bodies 11 to 17 are prepared. As the dielectric green sheets, those formed by applying a slurry made from a mixed powder which is mainly composed of $BaTiO_3$ and contains Co onto a film by doctor blading can be used.

Next, conductor patterns corresponding to the first to third internal electrodes 21 to 26 are formed on the dielectric green sheets to construct the dielectric bodies 12 to 17. Each conductor pattern is formed by screen-printing an electroconductive paste mainly composed of silver or nickel and then drying it, for example. Then, the green sheets are successively laminated, bonded together under pressure, cut into chips, and then fired at a predetermined temperature (e.g., 800 to 900° C.). This forms the capacitor part 1.

Subsequently, the electrode portions corresponding to the first to third varistor electrodes 41 to 53 and the portions corresponding to the first and second varistor layers 44, 54 are formed by printing in a predetermined order onto the first face 1a of the capacitor part 1 and baking. The first and second varistor layers 44, 54 are formed by a material which is mainly composed of ZnO and contains Co. Since the first and second varistor layers 44, 54 and the dielectric bodies 11 to 17 contain Co, they can prevent Co from dispersing at the boundary surfaces between the first and second varistor layers 44, 54 and dielectric bodies 11 to 17. Therefore, the first and second varistor layers 44, 54 and the dielectric bodies 11 to 17 can be kept from changing their characteristics.

After forming the resistor R60 on the first face 1a, the protective layer 30 is formed so as to cover the first and second varistors V40, V50 and resistor R60. The protective layer 30 is formed by a material mainly composed of glass. Subsequently, an electroconductive paste for the metal pads 5a, 7a, 9a is printed onto the second face 1b and baked, so as to form the metal pads Sa, 7a, 9a. Thereafter, the solder balls 5b, 7b, 9b are formed, so as to make the I/O terminal electrodes 5, 7 and ground terminal electrode 9. The foregoing completes the low-pass filter F1.

In the low-pass filter F1 of this embodiment, the first internal electrodes 21, 23, 25 and third internal electrode 26 construct the first capacitor C1. The first internal electrodes 21, 23, 25 and second internal electrodes 22, 24 construct the second capacitor C2. The first and second capacitors C1, C2 and resistor R60 construct a π-type RC filter. The first varistor V40 is connected in parallel to the first capacitor C1, and the second varistor V50 is connected in parallel to the second capacitor C2, whereby a low-pass filter having an ESD protection function is constructed. Further, the first and second varistors V40, V50 and resistor R60 are arranged on the first face la of the capacitor part 1, whereas the I/O terminal electrodes 5, 7 and ground terminal electrode 9 are arranged on the second face 1b. Therefore, the low-pass filter having the structure mentioned above can be realized by one chip. Namely, the packaging density of the low-pass filter having an ESD protection function can be improved.

In the low-pass filter F1 of this embodiment, the first and second varistor electrodes 41, 42, 51, 52 are arranged on the first face 1a, while the first and second varistor layers 44, 54 are arranged so as to cover their corresponding two varistor electrodes 41, 42, 51, 52. Therefore, the first and second varistors V40, V50 can be constructed simply. Also, the size in a direction perpendicular to the first face la can be made smaller, so as to turn the low-pass filter having the above-mentioned structure into a smaller one-chip component.

The low-pass filter F1 in accordance with this embodiment uses varistors as components for ESD protection, and thus can be made less expensively than the case using zener diodes.

A low-pass filter having an ESD protection function may be realized by a π-type filter comprising two varistors and a resistance. However, it is hard to attain a desirable capacity by using varistors. Connecting the first and second capacitors C1, C2 in parallel to the varistors as in this embodiment can reliably secure a capacity.

Without being restricted to the above-mentioned embodiment, the present invention can be modified in various ways. For example, the low-pass filter F1 may comprise an inductor instead of the resistor R60 used in the above-mentioned embodiment. In this case, a π-type LC filter is constructed by the inductor and two capacitors.

The structure of the first and second varistors V40, V50 is not limited to the one mentioned above as long as they are arranged on the first face 1a and connected in parallel to their corresponding second capacitors C1, C2. For example, the third varistor electrodes 43, 53 may be omitted.

Second Embodiment

Figure 8:
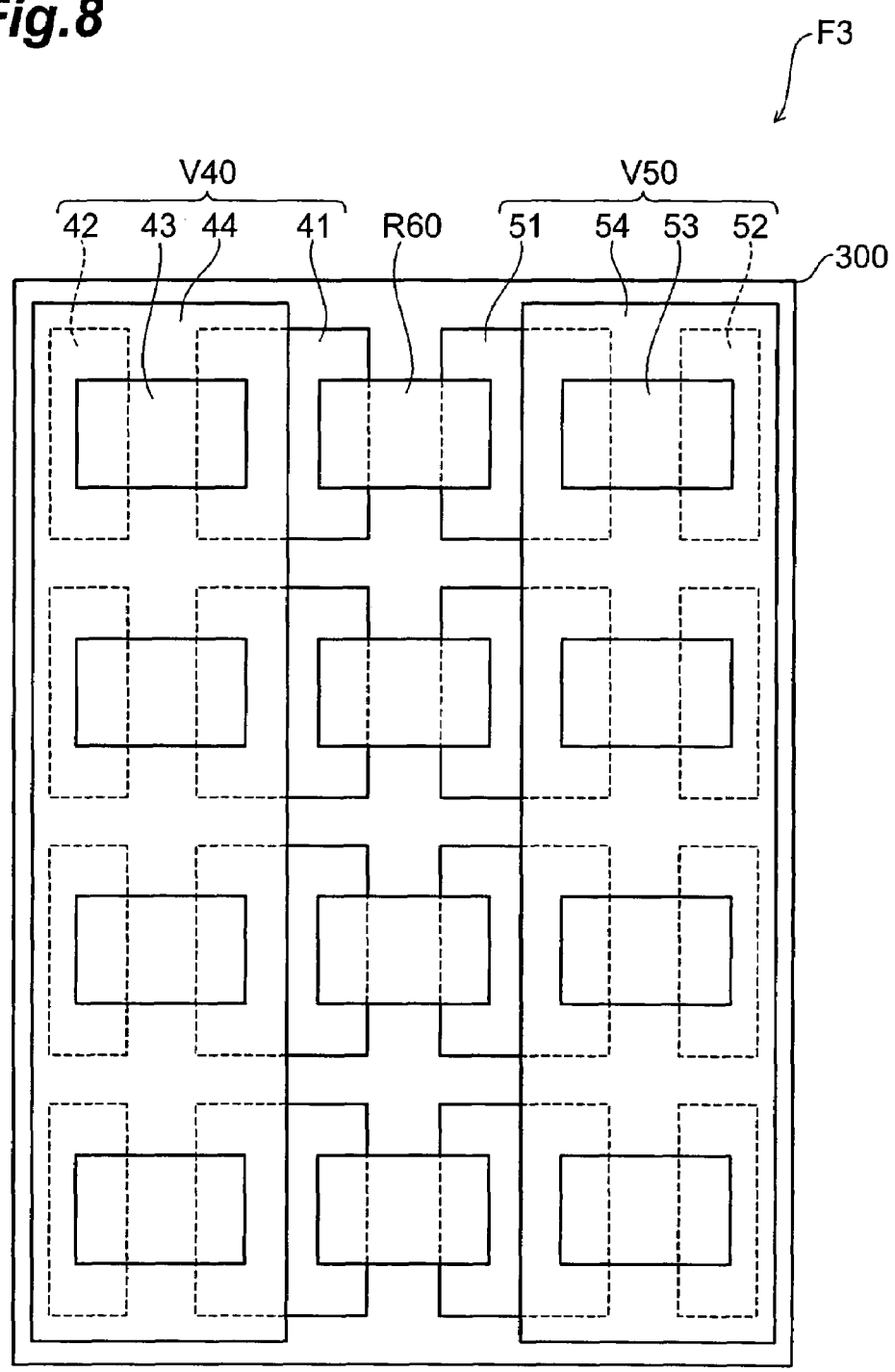
FIG. 8 is a view showing the varistor resistor part included in the low-pass filter array in accordance with the second embodiment.
Figure 9:
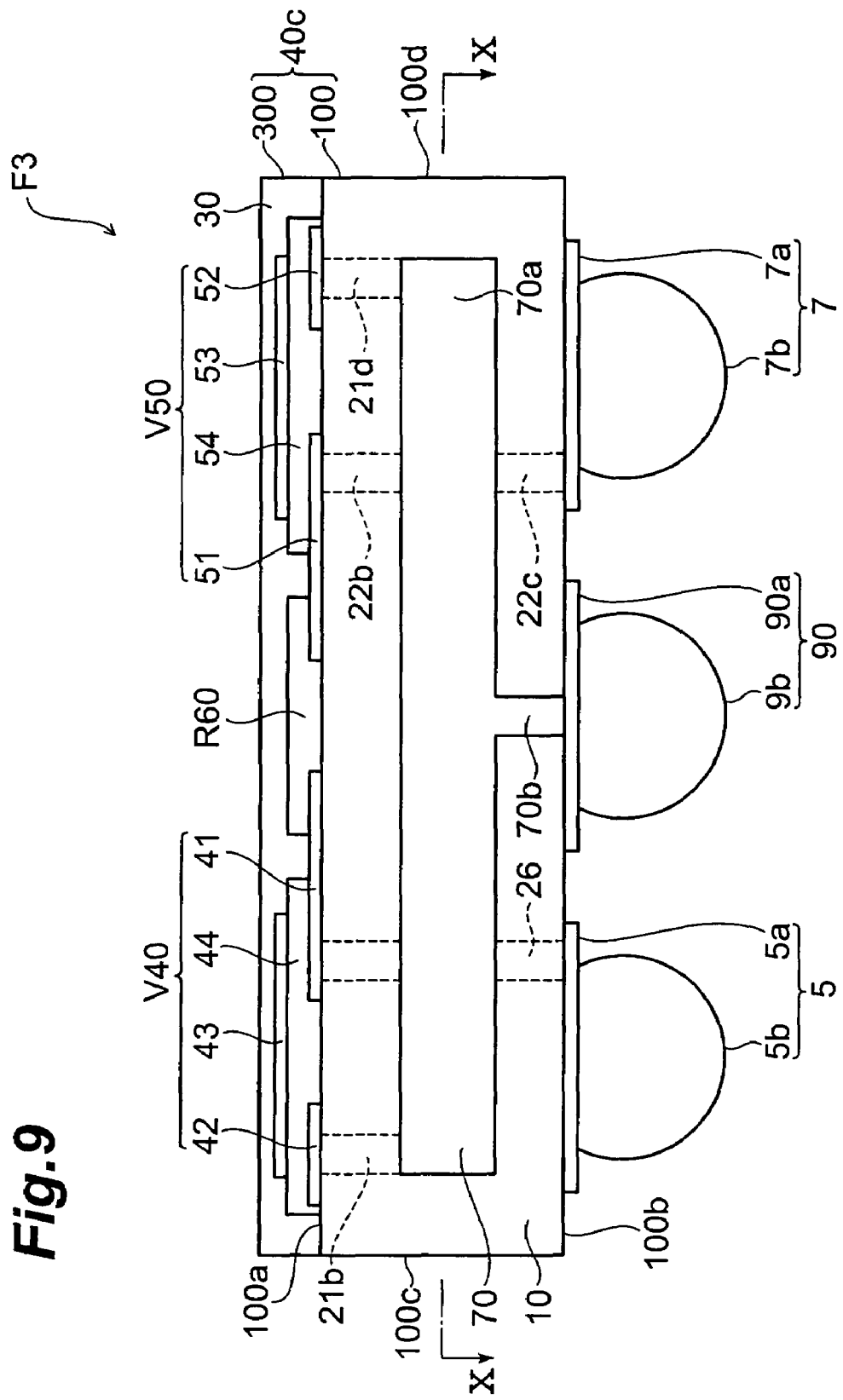
FIG. 9 is a view showing a cross-sectional structure of the low-pass filter array in accordance with the second embodiment.
Figure 10:
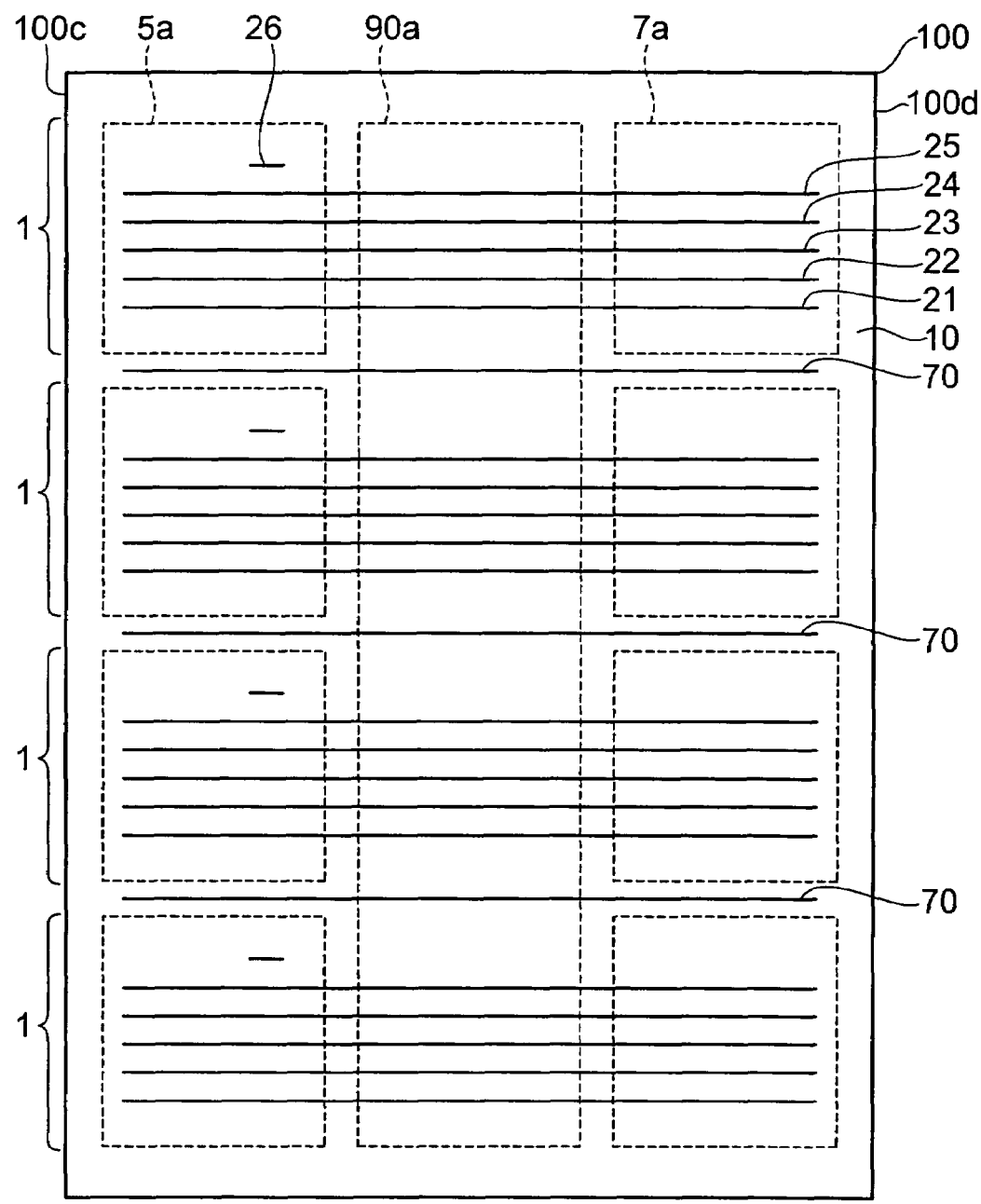
FIG. 10 is a schematic view showing a cross-sectional structure taken along the line X-X of FIG. 9.

A low-pass filter array in accordance with a second embodiment will now be explained. FIG. 8 is a view showing a varistor resistor part included in the low-pass filter array in accordance with the second embodiment. FIG. 9 is a schematic view showing a cross-sectional structure of the low-pass filter array in accordance with the second embodiment. FIG. 10 is a schematic view showing the cross-sectional structure taken along the line X-X of FIG. 9. The low-pass filter array F3 in accordance with this embodiment comprises a capacitor part 100, a varistor resistor part 300, N pairs (where N is an integer of 2 or greater; N=4 in this embodiment) of I/O terminals 5, 7 (first and second external electrodes), and a ground terminal electrode 90 (third external electrode).

The capacitor part 100 is formed into a substantially rectangular parallelepiped form having first and second faces 100a, 100b opposing each other and faces 100c, 100d, perpendicular to the first and second faces 100a, 100b, opposing each other. The varistor resistor part 300 is arranged on the first face 100a of the capacitor part 100. The capacitor part 100 and varistor resistor part 300 constitute a main body 400. The main body 400 has a substantially rectangular parallelepiped form. For example, the main body 4 has a length of about 2.1 mm, a width of about 1.6 mm, and a thickness of about 0.6 mm.

The capacitor part 100 has four capacitor parts 1 and three (three in this embodiment) fourth internal electrodes 70. Namely, the capacitor part 100 has N dielectric bodies 10 each including dielectric bodies 11 to 17, N internal electrode groups each including the first to third internal electrodes 21 to 26, and the three fourth external electrodes 70.

The four capacitor parts 1 are arranged such that the four sets of first to third internal electrodes 21 to 26 overlap each other in the capacitor part 100 when seen in the laminating direction. Namely, in the capacitor part 100, the four internal electrode groups are arranged in a row in the opposing direction of the first to third internal electrodes 21 to 26. The direction of the row of the internal electrode groups is parallel to the laminating direction of the dielectric bodies 11 to 17. The dielectric body 17 of one of capacitor parts 1 adjacent to each other and the dielectric body 11 of the other capacitor part 1 are integrated to such an extent that their boundary is indiscernible.

The capacitor part 100 has the first and second faces 100a, 100b opposing each other. The first face 100a is constituted by the four first faces 1a of the four capacitor parts 1. The second face 100b is constituted by the four second faces 1b of the four capacitor parts 1.

The three fourth internal electrodes 70 are arranged between the capacitor parts 1 such as to have principal faces parallel to the main faces of the second internal electrodes 21 to 25. Each fourth internal electrode 70 is arranged between the dielectric body 17 of one of capacitor parts 1 adjacent to each other and the dielectric body 11 of the other capacitor part 1. Namely, each fourth internal electrode 70 is arranged between adjacent sets of first to third internal electrodes 21 to 26.

Each fourth internal electrode 70 includes a main electrode portion 70*a* and a lead portion 70*b*. The main electrode portion 70*a* is formed into a substantially rectangular shape, whose center portion overlaps the center portion of its corresponding dielectric body 11. The lead portion 70*b* is led from the second face 100*b* side of the center portion of the main electrode portion 70*a*, so as to be exposed at the second face 100*b*.

The four pairs of I/O terminal electrodes 5, 7 correspond to four capacitor parts 1, respectively, one in each pair functioning as an input terminal electrode, whereas the other functioning as an output terminal electrode. The ground terminal electrode 90 corresponds to all of the fourth capacitor parts 1, and is connected to a ground pattern of an external board (not depicted) to which the low-pass filter array F3 is mounted.

As mentioned above, the I/O terminal electrodes 5, 7 and ground terminal electrode 90 comprise their corresponding metal pads 5*a*, 7*a*, 90*a* and solder balls 5*b*, 7*b*, 90*b*. The four pairs of I/O terminal electrodes 5, 7 and the ground terminal electrode 90 are electrically insulated from each other, and are arranged on the second face 100*b* of the capacitor part 100. The four I/O terminal electrodes 5 are arranged in a single row along the laminating direction on the second face 100*b* on the face 100*c* side. The four I/O terminal electrodes 7 are arranged in a single row along the laminating direction on the second face 100*b* on the face 100*d* side. Each pair of I/O terminal electrodes 5, 7 are arranged in a row in a direction perpendicular to the laminating direction on the second face 100*b*.

Each I/O terminal electrode 5 is connected physically and electrically to the third internal electrode 26 of its corresponding capacitor part 1. Each I/O terminal electrode 7 is connected physically and electrically to its corresponding second internal electrodes 22, 24.

The metal pad 90*a* of the ground terminal electrode 90 is formed into a substantially rectangular shape when seen in a direction perpendicular to the second face 100*b*. The metal pad 90*a* is arranged between the row of I/O terminal electrodes 5 and the row of I/O terminal electrodes 7 such that its longitudinal direction is parallel to the laminating direction. The metal pad 90*a* extends from one end of each of the rows of I/O terminal electrodes 5, 7 to the other end.

The metal pad 90*a* of the ground terminal electrode 90 is formed so as to cover areas where the second lead portions 21*c*, 23*c*, 25*c* of four sets of first internal electrodes 21, 23, 25 and the lead portions 70*b* of the three fourth internal electrodes 70 are exposed in the second face 100*b*. The metal pad 90*a* is connected physically and electrically to each of the four sets of second lead portions 21*c*, 23*c*, 25*c* and three lead portions 70*b*. Namely, the ground terminal electrode 90 is connected to the four sets of first internal electrodes 21, 23, 25 and three fourth internal electrodes 70.

The varistor resistor part 300 comprises a protective layer 30, four first varistors V40 corresponding to the four capacitor parts 1, four second varistors V50, and four resistors R60. The fourth sets of first and second varistors V40, V50 and resistors R60 are arranged on the first face 100*a* of the capacitor part 100.

As mentioned above, the protective layer 30 functions to protect the first and second varistors V40, V50 and resistors R60 and electrically insulate them from the outside. FIG. 8 is a plan view of the varistor resistor part, omitting the protective layer 30.

The four first varistors V40 are arranged in a single row along the laminating direction on the first face 100*a* on the end face 100*c* side. The four second varistors V50 are arranged in a single row along the laminating direction on the first face 100*a* on the end face 100*d* side. The four resistors R60 are arranged in a single row along the laminating direction between the first and second varistors V40, V50 on the first face 100*a*. Each set of the corresponding first and second varistors V40, V50 and resistor R60 are arranged in a row in a direction perpendicular to the laminating direction on the second face 100*b*.

The first and second varistors V40, V50 and resistors R60 have their corresponding structures mentioned above. As mentioned above, each resistor R60 is connected to its corresponding varistor electrodes 42, 52 physically and electrically.

The first varistors V40 have an integrally formed first varistor layer 44. The second varistors V50 have an integrally formed second varistor layer 54. Each of the first and second varistor layers 44, 54 is formed into a substantially rectangular parallelepiped form when seen in a direction perpendicular to the first face 100*a*, while having a longitudinal direction parallel to the laminating direction. This can further enhance the mechanical strength of the varistor resistor part 300. Namely, the mechanical strength of the main body 400 can be made higher.

Each first varistor electrode 41 is connected physically and electrically to the third internal electrode of its corresponding capacitor part 1. Each second varistor electrode 42 is connected physically and electrically to the first internal electrodes 21, 23, 25 of its corresponding capacitor part 1. Each first varistor electrode 51 is connected physically and electrically to the second internal electrodes 22, 24 of its corresponding capacitor part 1. Each second varistor electrode 52 is connected physically and electrically to the first internal electrodes 21, 23, 25 of its corresponding capacitor part 1.

Figure 11:
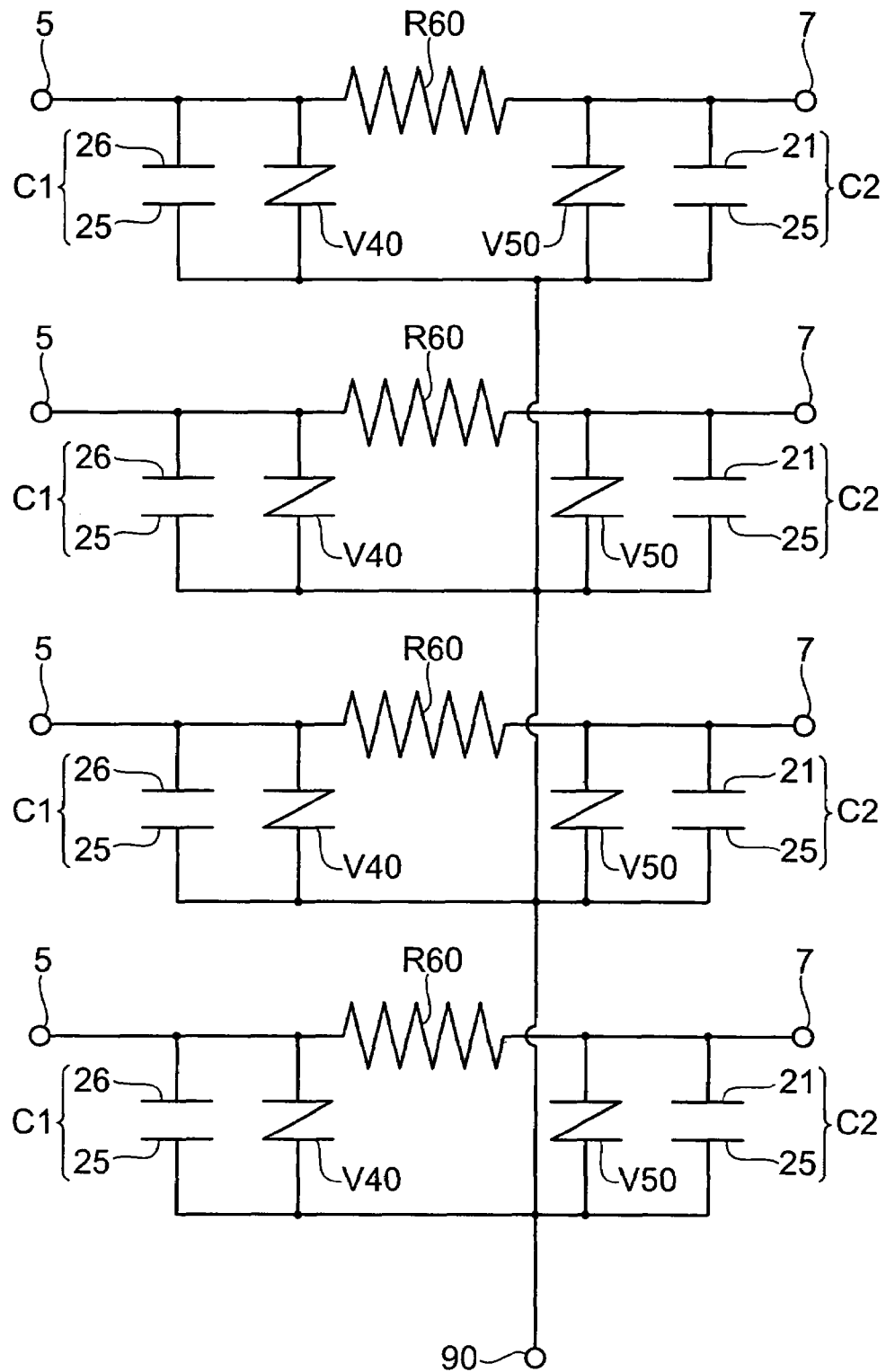
FIG. 11 is an equivalent circuit diagram of the low-pass filter array in accordance with the second embodiment.

Namely, as shown in FIG. 11, the low-pass filter array F3 constructs four π-type RC filters by four first capacitors C1, four second capacitors C2, and four resistors R60, and a low-pass filter comprising four first varistors V40 connected in parallel to respective four first capacitors C1 and four second varistors V50 connected in parallel to respective four second capacitors C2.

In the low-pass filter array F3 of this embodiment, four each of the first internal electrodes 21, 23, 25 and four third internal electrodes 26 construct four first capacitors C1. Four each of the first internal electrodes 21, 23, 25 and four each of the second internal electrodes 22, 24 construct four second capacitors C2. The four first capacitors C1, four second capacitors C2, and four first resistors R60 construct four π-type RC filters. The four first varistors V40 are connected in parallel to the respective four first capacitors C1, while the four second varistors V50 are connected in parallel to the respective four second capacitors C2, whereby the low-pass filter array F3 includes four low-pass filters each having an ESD protection function. Since the four sets of first and second varistors V40, V50 and four resistors R60 are arranged on the first face 100*a* of the capacitor part 100, while four pairs of I/O terminal electrodes 5, 7 and the ground terminal electrode 90 are arranged on the second face 100*b*, the low-pass filter array having the structure mentioned above can be realized by one chip. Thus, the packaging density of the low-pass filter array having an ESD protection function can be improved.

Since the fourth internal electrodes 70 electrically connected to the ground terminal electrode 90 are arranged between the capacitor parts 1 adjacent to each other, the low-pass filter array F3 of this embodiment can suppress the crosstalk between the low-pass filters.

In the low-pass filter array F3 of this embodiment, the first varistor layer 44 corresponding to the four first varistors V40 is formed integrally, while the second varistor layer 54 corresponding to the four second varistors V50 is formed integrally. Therefore, the first and second varistor layers 44, 54 function as reinforcements, whereby the mechanical strength of the main body 400 can be enhanced.

In the low-pass filter array F3 of this embodiment, the first to fourth varistor electrodes 41, 42, 51, 52 are arranged on the first face 100a while the first and second varistor layers 44, 54 are arranged so as to cover their corresponding two electrodes, whereby the first and second varistors V40, V50 can be constructed simply. Also, the size in a direction perpendicular to the first face 100a can be made smaller, so as to turn the low-pass filter array having the above-mentioned circuit structure into a smaller one-chip component.

Without being restricted to the above-mentioned embodiment, the present invention can be modified in various ways. For example, though the low-pass filter array F3 comprises the fourth internal electrodes 70 in the above-mentioned embodiment, this is not restrictive.

Though the first and second varistor layers 44, 54 included in four each of the first and second varistors V40, V50 are each formed integrally, this is not restrictive. Each of the first and second varistor layers 44, 54 may be divided into four, so as to be included in four each of the first and second varistors V40, V50, respectively. This can suppress the crosstalk between the four sets of first and second varistors.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A low-pass filter comprising:
a capacitor including a dielectric body having first and second faces opposing each other, and first to third internal electrodes arranged within the dielectric body;
first and second varistors arranged on the first face;
a resistor arranged on the first face; and
first to third external electrodes arranged on the second face;
wherein the first internal electrode is arranged so as to be connected to the third external electrode physically and electrically while extending in a direction parallel to the opposing direction of the first and second faces;
wherein the second internal electrode is arranged so as to be connected to the second external electrode physically and electrically while at least a portion of the second internal electrode opposes the first internal electrode through at least a portion of the dielectric body;
wherein the third internal electrode is arranged so as to be connected to the first external electrode physically and electrically while at least a portion of the third internal electrode opposes the first internal electrode through at least a portion of the dielectric body;
wherein the first varistor is connected in parallel to a capacitor constituted by the first and third internal electrodes;
wherein the second varistor is connected in parallel to a capacitor constituted by the first and second internal electrodes; and
wherein the resistor is connected electrically to the second and third internal electrodes.

2. A low-pass filter according to claim 1,
wherein the first varistor has first and second electrodes and a first varistor layer including a region positioned between the first and second electrodes and exhibiting a nonlinear current-voltage characteristic; and
wherein the second varistor has third and fourth electrodes and a second varistor layer including a region positioned between the first and second electrodes and exhibiting a nonlinear current-voltage characteristic.

3. A low-pass filter according to claim 2,
wherein the first to fourth electrodes are arranged on the first face;
wherein the first varistor layer is arranged so as to cover at least a portion of each of the first and second electrodes;
wherein the second varistor layer is arranged so as to cover at least a portion of each of the third and fourth electrodes;
wherein the first internal electrode is connected to the second and fourth electrodes physically and electrically;
wherein the second internal electrode is connected to the third electrode physically and electrically;
wherein the third internal electrode is connected to the first electrode physically and electrically; and
wherein the resistor is connected to the first and third electrodes physically and electrically.

4. A low-pass filter according to claim 3,
wherein the first varistor further comprises an electrode arranged so as to oppose the first and second electrodes through the first varistor layer; and
wherein the second varistor further comprises an electrode arranged so as to oppose the third and fourth electrodes through the second varistor layer.

5. A low-pass filter array comprising:
a capacitor including a dielectric body having first and second faces opposing each other, and N internal electrode groups (where N is an integer of 2 or greater), arranged within the dielectric body, each having first to third internal electrodes;
N first varistors and N second varistors arranged on the first face so as to correspond to the N internal electrode groups;
N resistors arranged on the first face so as to correspond to the N internal electrode groups; and
N external electrode groups, arranged on the second face so as to correspond to the N internal electrode groups, each having first to third external electrodes;
wherein, in each of the internal electrode groups,
the first internal electrode is arranged so as to be connected physically and electrically to the third external electrode of the external electrode group corresponding thereto while extending in a direction parallel to the opposing direction of the first and second faces,
the second internal electrode is arranged so as to be connected physically and electrically to the second external electrode of the external electrode group corresponding thereto while at least a portion of the second internal electrode opposes the first internal electrode corresponding thereto through at least a portion of the dielectric body,
the third internal electrode is arranged so as to be connected physically and electrically to the first external electrode of the external electrode group corresponding thereto while at least a portion of the third internal electrode opposes the first internal electrode corresponding thereto through at least a portion of the dielectric body, each of the first varistors is connected in parallel to a capacitor constituted by the first and third internal electrodes of the internal electrode group corresponding thereto, each of the second varistors is connected in parallel to a capacitor constituted by the first and second internal electrodes of the internal electrode group corresponding thereto, and each of the resistors is connected electrically to the second and third internal electrodes of the internal electrode group corresponding thereto.

6. A low-pass filter array according to claim 5, wherein the N internal electrode groups are arranged in a row within the dielectric body along the opposing direction of the first internal electrode and the second and third internal electrodes;

the low-pass filter array further comprising an internal electrode arranged so as to extend in the direction parallel to the opposing direction of the first and second faces between the internal electrode groups adjacent to each other while being connected electrically to one of the third external electrodes.

7. A low-pass filter array according to claim 5, wherein each of the first varistors has first and second electrodes and a first varistor layer including a region positioned between the first and second electrodes and exhibiting a nonlinear current-voltage characteristic; and wherein each of the second varistors has third and fourth electrodes and a second varistor layer including a region positioned between the first and second electrodes and exhibiting a nonlinear current-voltage characteristic.

8. A low-pass filter array according to claim 7, wherein the first to fourth electrodes are arranged on the first face;

wherein the first varistor layer is arranged so as to cover at least a portion of each of the first and second electrodes;

wherein the second varistor layer is arranged so as to cover at least a portion of each of the third and fourth electrodes;

wherein the first internal electrode is connected to the second and fourth electrodes physically and electrically;

wherein the second internal electrode is connected to the third electrode physically and electrically;

wherein the third internal electrode is connected to the first electrode physically and electrically; and wherein the resistor is connected to the first and third electrodes physically and electrically.

9. A low-pass filter array according to claim 8, wherein each of the first varistors further comprises an electrode arranged so as to oppose the first and second electrodes through the first varistor layer; and wherein each of the second varistors further comprises an electrode arranged so as to oppose the third and fourth electrodes through the second varistor layer.

10. A low-pass filter array according to claim 8, wherein the N internal electrode groups are arranged in a row within the dielectric body along the opposing direction of the first internal electrode and the second and third internal electrodes;

wherein the first and second electrodes of the first varistors are respectively arranged in a row along the direction of the row of the N internal electrode groups;

wherein the first varistor layers of the first varistors are formed integrally;

wherein the third and fourth electrodes of the second varistors are respectively arranged in a row along the direction of the row of the N internal electrode groups; and wherein the second varistor layers of the second varistors are formed integrally.

11. A low-pass filter array according to claim 5, wherein the third external electrodes of the external electrode groups are formed integrally.

* * * * *